(12) United States Patent
Koshiishi et al.

(10) Patent No.: US 8,084,375 B2
(45) Date of Patent: Dec. 27, 2011

(54) HOT EDGE RING WITH SLOPED UPPER SURFACE

(75) Inventors: Akira Koshiishi, San Jose, CA (US); Sathya Mani, Fremont, CA (US); Gautam Bhattacharyya, San Ramon, CA (US); Gregory R. Bettencourt, Fremont, CA (US); Sandy Chao, Sunol, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/917,969

(22) Filed: Nov. 2, 2010

(65) Prior Publication Data

US 2011/0104884 A1 May 5, 2011

Related U.S. Application Data

(60) Provisional application No. 61/257,250, filed on Nov. 2, 2009.

(51) Int. Cl.
*H01L 21/00* (2006.01)
*C23C 16/00* (2006.01)

(52) U.S. Cl. ........ 438/800; 438/689; 438/758; 118/728; 118/723 R; 156/345.51

(58) Field of Classification Search ................. None
See application file for complete search history.

(56) References Cited

U.S. PATENT DOCUMENTS

| 5,411,624 | A | 5/1995 | Hirano et al. |
|---|---|---|---|
| 6,073,577 | A | 6/2000 | Lilleland et al. |
| 7,244,336 | B2 * | 7/2007 | Fischer et al. ........... 156/345.51 |
| 7,252,738 | B2 * | 8/2007 | Tong et al. .............. 156/345.29 |
| 7,658,816 | B2 * | 2/2010 | Koshiishi et al. ........ 156/345.43 |
| 7,758,764 | B2 * | 7/2010 | Dhindsa et al. ................. 216/71 |
| 2004/0074605 | A1 | 4/2004 | Nezu et al. |
| 2005/0005859 | A1 * | 1/2005 | Koshiishi et al. ............. 118/728 |
| 2005/0133164 | A1 * | 6/2005 | Fischer et al. ........... 156/345.51 |
| 2005/0133760 | A1 | 6/2005 | Farrand et al. |
| 2007/0187038 | A1 | 8/2007 | Ren et al. |
| 2007/0283884 | A1 * | 12/2007 | Tiller et al. ................... 118/715 |
| 2008/0090417 | A1 | 4/2008 | de la Llera et al. |
| 2008/0241420 | A1 * | 10/2008 | Dhindsa et al. .............. 427/569 |
| 2008/0308228 | A1 | 12/2008 | Stevenson et al. |
| 2009/0200269 | A1 * | 8/2009 | Kadkhodayan et al. ........ 216/71 |

* cited by examiner

*Primary Examiner* — Scott B Geyer
(74) *Attorney, Agent, or Firm* — Buchanan Ingersoll & Rooney PC

(57) ABSTRACT

A hot edge ring with extended lifetime comprises an annular body having a sloped upper surface. The hot edge ring includes a step underlying an outer edge of a semiconductor substrate supported in a plasma processing chamber wherein plasma is used to process the substrate. The step includes a vertical surface which surrounds the outer edge of the substrate and the sloped upper surface extends upwardly and outwardly from the upper periphery of the vertical surface.

15 Claims, 5 Drawing Sheets

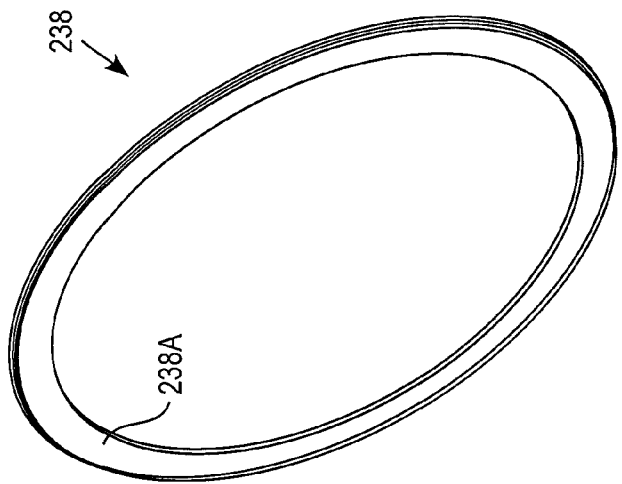
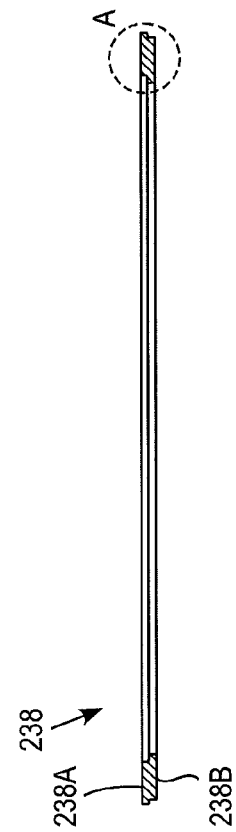
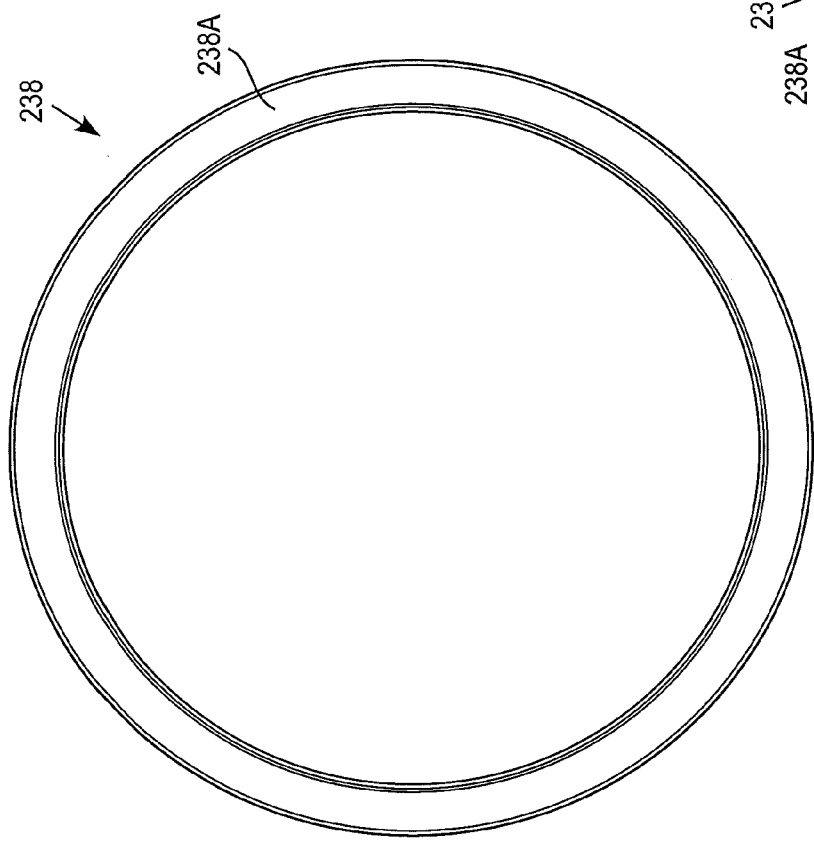

HOT EDGE RING WITH SLOPED UPPER SURFACE

This application claims priority under 35 U.S.C. §119 to U.S. Provisional Application No. 61/257,250 entitled HOT EDGE RING WITH SLOPED UPPER SURFACE, filed Nov. 2, 2009, the entire content of which is hereby incorporated by reference.

BACKGROUND

Plasma processing apparatuses are used to process semiconductor substrates by techniques including etching, physical vapor deposition (PVD), chemical vapor deposition (CVD), and resist removal. One type of plasma processing apparatus used in plasma processing includes a reaction chamber containing top and bottom electrodes. A radio frequency (RF) power is applied between the electrodes to excite a process gas into a plasma for processing semiconductor substrates in the reaction chamber.

One challenge facing designers of plasma processing chambers is that the plasma etch conditions create significant ion bombardment of the surfaces of the processing chamber that are exposed to the plasma. This ion bombardment, combined with plasma chemistries and/or etch byproducts, can produce significant erosion, corrosion and corrosion-erosion of the plasma-exposed surfaces of the processing chamber. Another challenge is to control etch rate uniformity across a semiconductor substrate (e.g., silicon substrate), in particular, to make the etch rate at the center of the substrate equal to the etch rate at the edge. To alleviate such nonuniformities, a hot edge ring and an underlying RF coupling ring have been implemented fitting around the substrate. The hot edge ring is a consumable part and requires regular cleaning or replacement. It is desirable to extend the lifetime of the hot edge ring in order to increase mean time between cleaning or replacement and to decrease the cost of ownership. A hot edge ring with extended RF lifetime is described herein.

SUMMARY

A hot edge ring is adapted to surround a semiconductor substrate supported in a plasma processing chamber wherein plasma is generated, the hot edge ring comprising an annular body having an inner vertical surface and a sloped upper surface. The annular body is configured to be supported on an annular support surface of a substrate support. The inner vertical surface surrounds the substrate support, and the sloped upper surface extends upwardly and outwardly from the periphery of the semiconductor substrate.

In a preferred embodiment, the inner surface has a diameter of about 11.7 inches, the sloped upper surface has a width of about 0.75 inches, the first step has a horizontal surface with an outer diameter of about 11.9 inches, substantially perpendicular to a center axis of the hot edge ring, and extending outwardly from an upper periphery of the inner surface, the first step has a vertical surface with a height of about 0.075 inch, substantially parallel to the center axis of the hot edge ring and extending upwardly from an outer periphery of the horizontal surface to an inner periphery of the sloped upper surface, and an opening angle of the truncated conical surface of the sloped upper surface is about 175° to 179°.

In the preferred embodiment, the outer surface has a diameter of about 13.4 inches, the second step has a vertical surface with a height of about 0.11 inch, substantially parallel to the center axis of the hot edge ring and extending upwardly from an outer periphery of the lower surface, the second step has a horizontal surface with an inner diameter of about 13.3 inches, substantially perpendicular to a center axis of the hot edge ring, and extending outwardly from an upper periphery of the vertical surface to a lower periphery of the outer surface.

The edge ring can be made of low-resistivity boron-doped single-crystalline silicon with a resistivity between about 5 and 100 mΩ·cm or CVD SiC having a resistivity of 5000 ohm-cm or less.

In another embodiment, the hot edge ring includes a flat edge at a single location along an inner periphery of the hot edge ring and a single hole extending between the sloped upper surface and the lower surface of the hot edge ring. In this embodiment, the hole has a diameter of about 0.3 inches with a center of the hole about 6.4 inches from the center of the hot edge ring and the flat edge is located on an opposite side of the hot edge ring from the location of the hole, the flat edge located about 5.8 inches from the center of the hot edge ring and the flat edge lying in an axial plane parallel to a center axis of the hot edge ring, the axial plane perpendicular to a radial line passing through the center of the hot edge ring

BRIEF DESCRIPTION OF FIGURES

FIG. 3A is a top view of a hot edge ring in FIG. 2.

FIG. 3B is a perspective view of the hot edge ring in FIG. 2

FIG. 3C is a cross sectional view of the hot edge ring in FIG. 2.

DETAILED DESCRIPTION

Figure 1:
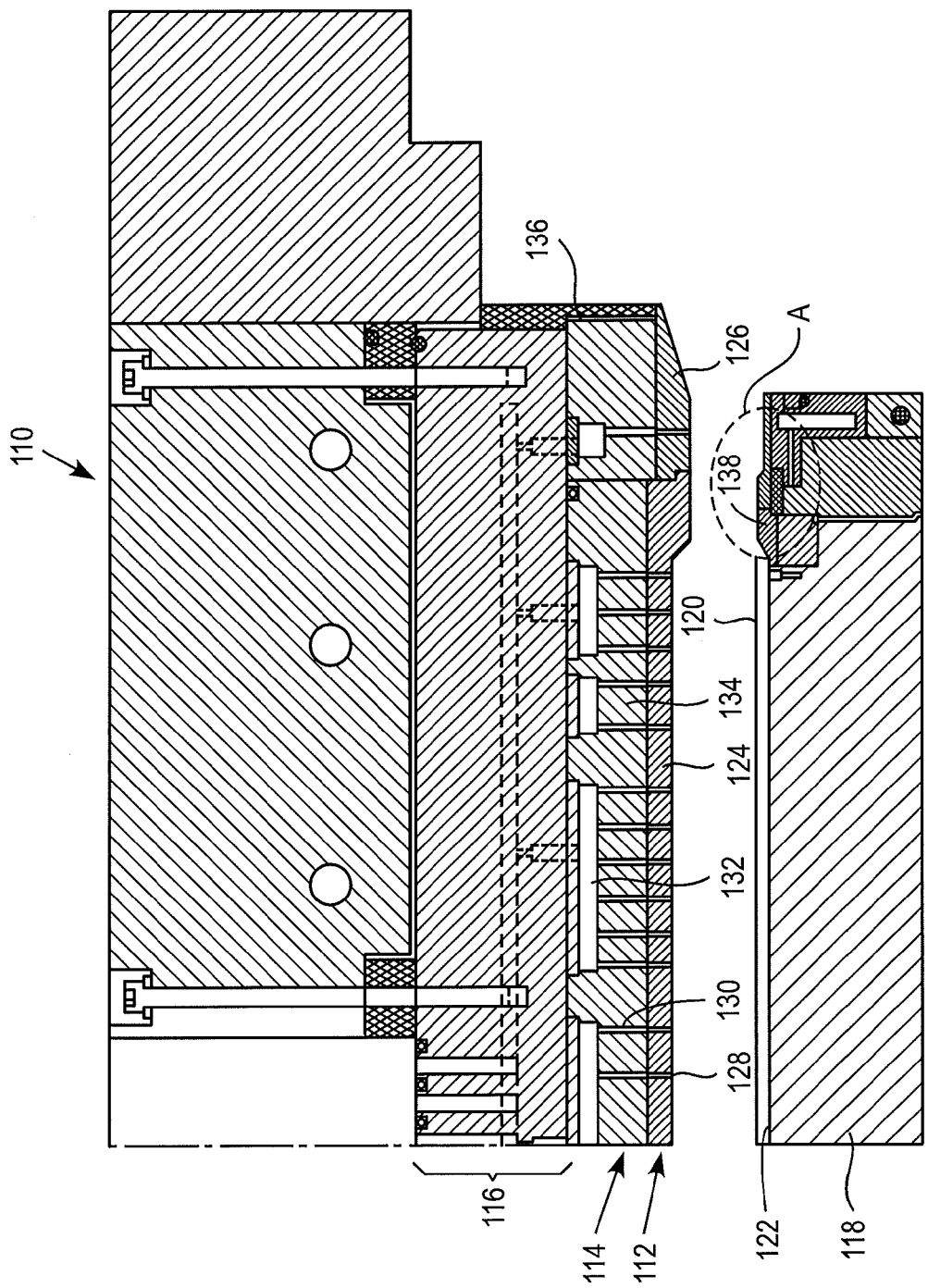
FIG. 1 illustrates a portion of an embodiment of a showerhead electrode assembly and a substrate support for a plasma processing apparatus.

As integrated circuit devices continue to shrink in both their physical size and their operating voltages, their associated manufacturing yields become more susceptible to particle and metallic impurity contamination. Consequently, fabricating integrated circuit devices having smaller physical sizes requires that the level of particulate and metal contamination be less than previously considered to be acceptable.

The manufacturing of the integrated circuit devices includes the use of plasma processing chambers. A plasma processing chamber may be configured to etch selected layers of a semiconductor substrate. Such a processing chamber is configured to receive process gases while a radio frequency (RF) power is applied to one or more electrodes in the processing chamber. The pressure inside the processing chamber is also controlled for the particular process. Upon applying the desired RF power to the electrode(s), the process gases in the chamber are activated such that a plasma is created. The plasma is thus generated to perform desired etching of selected layers of the semiconductor substrate.

One challenge facing designers of plasma processing chambers is that the plasma etch conditions create significant ion bombardment of the surfaces of the processing chamber that are exposed to the plasma. This ion bombardment, combined with plasma chemistries and/or etch byproducts, can produce significant erosion, corrosion and corrosion-erosion of the plasma-exposed surfaces of the processing chamber. As a result, surface materials are removed by physical and/or chemical attack, including erosion, corrosion and/or corrosion-erosion. This attack causes problems including short part lifetimes, increased parts costs, particulate contamination, on-substrate transition metal contamination and process drift. Parts with relatively short lifetimes are commonly referred to as consumables. Short lifetimes of consumable parts increase the cost of ownership.

Another challenge is to control etch rate uniformity across a semiconductor substrate (e.g., silicon substrate), in particular, to make the etch rate at the center of the substrate equal to the etch rate at the edge. Therefore, substrate boundary conditions are preferably designed for achieving uniformity across the substrate in regard to parameters such as process gas composition, process gas pressure, substrate temperature, RF power, and plasma density.

Some plasma processing chambers are designed to have an RF power applied to a powered electrode underlying an electrostatic clamping electrode, both of which are incorporated in a substrate support that supports a semiconductor substrate undergoing plasma processing. However, because the outer edge of the substrate may overhang the bottom electrode and/or the RF impedance path from the powered electrode through the electrostatic clamping electrode and substrate to the plasma can be different than the RF impedance path from an outer portion of the powered electrode to the plasma, a nonuniform plasma density which results at the edge of the substrate can lead to nonuniform processing of the substrate.

To alleviate such nonuniformities, a hot edge ring and an underlying RF coupling ring have been implemented fitting around the substrate. Improved plasma uniformity can be achieved by providing an RF impedance path which is similar at the center and edge of a substrate undergoing plasma processing. The RF impedance path can be manipulated by choice of materials and/or dimensions of the RF coupling ring.

The hot edge ring shields the RF coupling ring from plasma attack. The hot edge ring is a consumable part and requires regular cleaning or replacement. It is desirable to extend the lifetime of the hot edge ring in order to increase mean time between cleaning or replacement and to decrease the cost of ownership. A hot edge ring with extended RF lifetime is described herein.

FIG. 1 illustrates an exemplary embodiment of a showerhead electrode assembly 110 for a plasma processing chamber in which semiconductor substrates, e.g., silicon substrates, are processed. The showerhead electrode assembly 110 includes a showerhead electrode including a top electrode 112, a backing member 114 secured to the top electrode 112, and a thermal control plate 116. Details of such arrangements can be found in commonly-assigned U.S. Patent Publication Nos. 2008/0308228, 2008/0090417 and 2005/0133760, incorporated herein by reference. A substrate support 118 (only a portion of which is shown in FIG. 1) including a bottom electrode and an electrostatic clamping electrode (e.g., electrostatic chuck) is positioned beneath the top electrode 112 in the plasma processing chamber. A substrate 120 subjected to plasma processing is electrostatically clamped on a substrate support surface 122 of the substrate support 118 (e.g., an electrostatic chuck).

In the illustrated embodiment, the top electrode 112 of the showerhead electrode includes an inner electrode member 124, and an optional outer electrode member 126 of any suitable material or combination of materials such as high purity single crystal silicon, polycrystalline silicon, silicon carbide (SiC). The inner electrode member 124 is preferably a cylindrical plate (e.g., a plate composed of silicon). The inner electrode member 124 can have a diameter smaller than, equal to, or larger than a substrate to be processed, e.g., up to 12 inches (300 mm) or larger if the plate is made of silicon. In a preferred embodiment, the showerhead electrode assembly 110 is large enough for processing large substrates, such as semiconductor substrates having a diameter of 300 mm or larger. For 300 mm substrates, the top electrode 112 is at least 300 mm in diameter. However, the showerhead electrode assembly can be sized to process other substrate sizes or substrates having a non-circular configuration.

In the illustrated embodiment, the inner electrode member 124 is wider than substrate 120. For processing 300 mm substrates, the outer electrode member 126 is provided to expand the diameter of the top electrode 112 from about 15 inches to about 17 inches. The outer electrode member 126 can be a continuous member (e.g., a continuous polycrystalline silicon ring), or a segmented member (e.g., including 2-6 separate segments arranged in a ring configuration, such as segments composed of silicon). In embodiments of the top electrode 112 that include a multiple-segment, outer electrode member 126, the segments preferably have edges, which overlap each other to protect an underlying bonding material from exposure to plasma. Details of such arrangements can be found in commonly-assigned U.S. Patent Publication No. 2007/0187038, incorporated herein by reference.

The inner electrode member 124 preferably includes multiple gas passages 128 extending through and in correspondence with multiple gas passages 130 formed in the backing member 114 for injecting process gas into a space between the top electrode 112 and the substrate support 118. Backing member 114 includes multiple plenums 132 to distribute process gases to the gas passages 128 and 130 in the inner electrode member 124 and backing member 114, respectively.

Silicon is a preferred material for plasma exposed surfaces of the inner electrode member 124 and the outer electrode member 126. High-purity, single crystal silicon minimizes contamination of substrates during plasma processing and also wears smoothly during plasma processing, thereby minimizing particles. Alternative materials that can be used for plasma-exposed surfaces of the top electrode 112 include polycrystalline silicon, SiC or AlN, for example. In the illustrated embodiment, the backing member 114 includes a backing plate 134 attached to inner electrode 124 and a backing ring 136 attached to outer electrode 126, extending around the periphery of backing plate 134. In the embodiment, the inner electrode member 124 is co-extensive with the backing plate 134, and the outer electrode member 126 is co-extensive with the surrounding backing ring 136. However, the backing plate 134 can extend beyond the inner electrode member 124 such that a single backing plate can be used to support the inner electrode member 124 and the outer electrode member 126. The inner electrode member 124 and the outer electrode member 126 are preferably attached to the backing member 114 by a bonding material and/or mechanical fasteners.

The backing plate 130 and backing ring 136 are preferably made of a material that is chemically compatible with process gases used for processing semiconductor substrates in the plasma processing chamber, and is electrically and thermally conductive. Exemplary suitable materials that can be used to make the backing member 114 include aluminum, aluminum alloys, graphite and SiC.

The top electrode 112 can be attached to the backing plate 134 and backing ring 136 with a suitable thermally and electrically conductive elastomeric bonding material that accommodates thermal stresses, and transfers heat and electrical energy between the top electrode 112 and the backing plate 134 and backing ring 136. The use of elastomers for bonding together surfaces of an electrode assembly is described, for example, in commonly-owned U.S. Pat. No. 6,073,577, which is incorporated herein by reference in its entirety.

In a capacitively coupled plasma processing chamber, a secondary ground may also be used in addition to the ground electrode. For example, the substrate support 118 can include a bottom electrode which is supplied RF energy at one or more frequencies and process gas can be supplied to the interior of the chamber through showerhead electrode 112 which is a grounded upper electrode. A secondary ground, located outwardly of the bottom electrode in the substrate support 118 can include an electrically grounded portion which extends generally in a plane containing the substrate 120 to be processed but separated from the substrate 120 by a hot edge ring 138. The hot edge ring 138 can be of electrically conductive or semiconductive material which becomes heated during plasma generation.

For control of etch rate uniformity on substrate 120 and matching the etch rate at the center of the substrate to the etch rate at the substrate edge, substrate boundary conditions are preferably designed for assuring continuity across the substrate in regard to the chemical exposure of the substrate edge, process pressure, and RF field strength. In order to minimize substrate contamination, the hot edge ring 138 is manufactured from a material compatible to the substrate itself. The material of the hot edge ring 138 is essentially low-resistivity boron-doped single-crystalline silicon with a resistivity between about 5 and 100 mΩ·cm.

Figure 2:
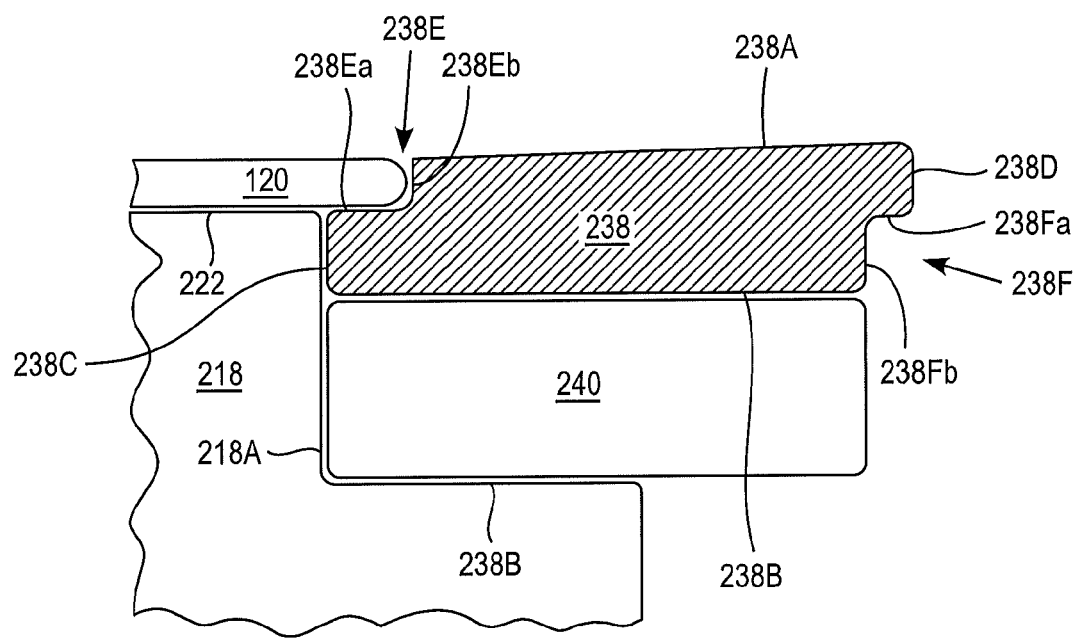
FIG. 2 shows an enlarged view of the area A in FIG. 1.
Figure 4:
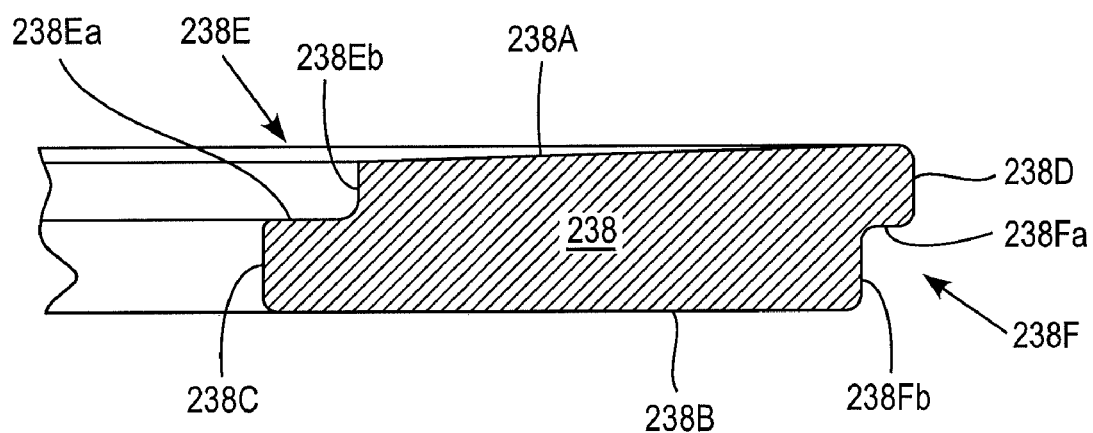
FIG. 4 is an enlarged view of the region A in FIG. 3C.

FIG. 2 illustrates the proximity of a hot edge ring 238 mounted on the substrate support 218. The substrate support 218 includes an outer vertical sidewall 218A, an annular support surface 218B and a substrate support surface 222. The outer vertical sidewall 218A extends upwardly from the annular support surface 218B; and the substrate support surface 222 is circular and extends inwardly from the outer vertical sidewall 218A. When the substrate 120 is placed on the substrate support surface 222, the substrate 120 overhangs the substrate support surface 222, such that the edge of the substrate 120 extends beyond the outer vertical sidewall 218A and over the hot edge ring 238. The hot edge ring 238 is configured to be supported on an RF coupling ring 240 placed on the annular support surface 218B.

FIGS. 3A, 3B, 3C and 4 show details of an embodiment of the hot edge ring 238. The hot edge ring 238 is an annular body having an inner surface 238C, an outer surface 238D, an upper surface 238A, a lower surface 238B, a step 238E between the upper surface 238A and the inner surface 238C, and a step 238F between the lower surface 238B and the outer surface 238D. The lower surface 238B is an annular surface substantially perpendicular to the center axis of the hot edge ring 238. The inner surface 238C is substantially parallel to the center axis of the hot edge ring 238, extends about 0.12 inch ("about" as used herein means±10%) upwardly from an inner periphery of the lower surface 238B, and has a diameter of about 11.7 inches. The step 238E has a horizontal surface 238Ea and a vertical surface 238Eb. The horizontal surface 238Ea is substantially perpendicular to the center axis of the hot edge ring 238, extends outwardly about 0.1 inch from an upper periphery of the inner surface 238C, and has an outer diameter of about 11.9 inches. The vertical surface 238Eb is substantially parallel to the center axis of the hot edge ring 238, extends about 0.075 inch upwardly from an outer periphery of the horizontal surface 238Ea. The step 238F has a horizontal surface 238Fa and a vertical surface 238Fb. The vertical surface 238Fb is substantially parallel to the center axis of the hot edge ring 238, extends about 0.11 inch upwardly from an outer periphery of the lower surface 238B, and has a diameter of about 13.3 inches. The horizontal surface 238Fa is substantially perpendicular to the center axis of the hot edge ring 238, extends outwardly from an upper periphery of the vertical surface 238Fb, and has an outer diameter of about 13.4 inches. The outer surface 238D is substantially parallel to the center axis of the hot edge ring 238, extends about 0.10 inch upwardly from an outer periphery of the horizontal surface 238Fa. The upper surface 238A is a truncated conical surface extending about 0.75 inch from an upper periphery of the vertical surface 238Eb to an upper periphery of the outer surface 238D. The opening angle of the truncated conical surface of the upper surface 238A is about 177°. Inner and outer corners between surfaces 238A, 238D, 238Fa, 238Fb, 238B, 238C, 238Ea, and 238Eb on the hot edge ring 238 are preferably rounded to radii between about 0.002 and 0.05 inch.

The sloped upper surface 238A of the hot edge ring 238 shapes the plasma sheath such that the lifetime of the hot edge ring 238 is optimally extended. The optimal opening angle of the truncated conical surface of the upper surface 238A can vary depending on the plasma process carried out in the chamber. For instance, at various power levels used for plasma etching with different etch gas chemistries to etch different layers on semiconductor substrates, the opening angle may set at an angle of about 175° to 179°.

During processing of a semiconductor substrate in a plasma processing chamber equipped with the hot edge ring 238, the substrate is supported on the substrate support 218, which is surrounded by the hot edge ring 238. A process gas is introduced into the plasma processing chamber, which is energized into the plasma state, to process the substrate. In one embodiment, the processing can include the deposition of conductive or dielectric materials. In another embodiment, processing the substrate can include high-density plasma etching of metals, dielectrics or photoresist stripping. For example, processing the substrate can include etching openings in a dielectric material using fluorocarbon and/or hydrofluorocarbon etching gas followed by in situ plasma cleaning.

According to a further embodiment, the hot edge ring can be made of silicon carbide (SiC), preferably high purity SiC (purity greater than 99.9%, preferably greater than 99.9995%) made by chemical vapor deposition (CVD). The resistivity of the CVD SiC is preferably less than 5000 ohm-cm. For example, the resistivity can be 1-5000 ohm-cm, e.g., 80-100 ohm-cm, 1-20 ohm-cm or less than 0.1 ohm-cm.

Figure 5A:
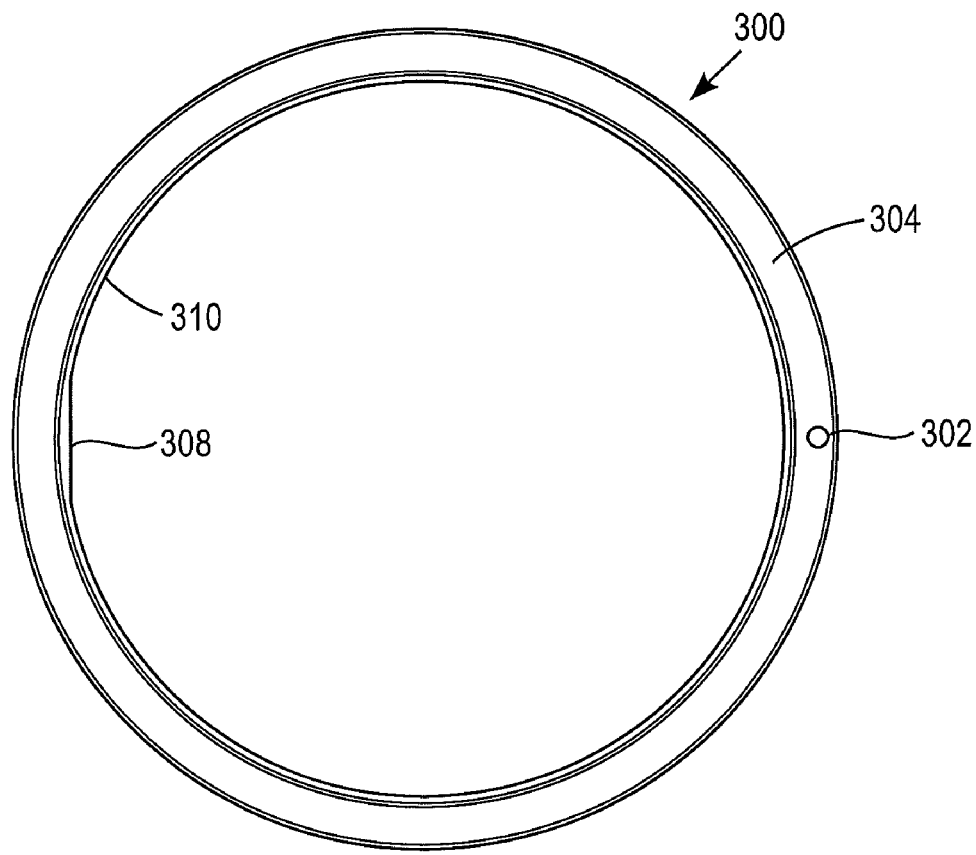
FIG. 5A is a top view of a hot edge ring with a modified configuration and FIG. 5B is a cross-sectional view of the edge ring shown in FIG. 5A.
Figure 5B:
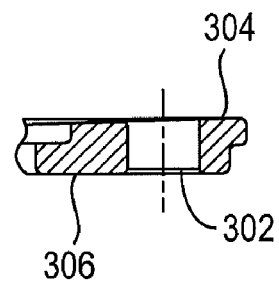

As shown in FIG. 5A, a hot edge ring 300 having the dimensions and configuration of edge ring 238 can further include a through hole 302 extending between the sloped upper surface 304 and lower surface 306. The through hole 302 can have a uniform diameter of about 0.3 inch with the center of the hole located about 6.4 inches from the center of the hot edge ring 300. FIG. 5B is a cross section of the hot edge ring 300 at the location of the hole 302. The hole 302 can include a 0.005 to 0.015 inch radius at its upper edge and a 0.010 inch wide 45° chamfer at its lower edge. The hot edge ring 300 can also include a flat edge 308 on its inner periphery 310. For example, the inner periphery 310 can have a diameter of 11.6 to 11.7 inches and the flat edge 308 can be located about 5.8 inches from the center of the edge ring 300. The hole 302 can be slightly offset from the center of the flat edge 308. For example, the hole 302 can be opposite from the flat edge 308 with the center of the hole 302 offset about 2° from the center point of the flat edge 308. The flat edge 308 lies in an axial plane parallel to a center axis of the hot edge ring 300 wherein the axial plane is perpendicular to a radial line passing through the center of the hot edge ring 300. The hole 302 receives a pick-up pin which provides feedback on the electrical bias on a wafer undergoing plasma processing. The flat edge 308 is used to align a wafer having a flat edge for wafer alignment and precise orientation.

While the hot edge ring with extended lifetime has been described in detail with reference to specific embodiments thereof, it will be apparent to those skilled in the art that various changes and modifications can be made, and equivalents employed, without departing from the scope of the appended claims.

We claim:

1. A hot edge ring configured to surround a semiconductor substrate in a plasma processing chamber wherein plasma is generated and used to process the semiconductor substrate, the plasma processing chamber comprising: a substrate support comprising a vertical sidewall extending between an outwardly extending annular support surface and a circular substrate support surface, the substrate support configured such that the semiconductor substrate is supported on the substrate support surface and an overhanging edge of the semiconductor substrate extends beyond the outer vertical sidewall; a radio-frequency (RF) coupling ring supported on the annular support surface; and the hot edge ring supported on the RF coupling ring; the hot edge ring including an annular body comprising:
   a lower surface configured to be supported on the RF coupling ring;
   an inner surface extending upwardly from an inner periphery of the lower surface and configured to surround the vertical sidewall;
   a first step extending outwardly from an upper periphery from the inner surface and downwardly from an inner periphery of a sloped upper surface, and configured to underlie the overhanging edge of the semiconductor substrate;
   the sloped upper surface comprising a truncated conical surface extending outwardly and upwardly from an upper periphery of the first step;
   an outer surface extending downwardly from an outer periphery of the sloped upper surface; and
   a second step extending inwardly from an lower periphery of the outer surface and upwardly from an outer periphery of the lower surface.

2. The hot edge ring of claim 1, wherein:
   the inner surface has a diameter of about 11.7 inches;
   the sloped upper surface has a width of about 0.75 inches;
   the first step has a horizontal surface with an outer diameter of about 11.9 inches, substantially perpendicular to a center axis of the hot edge ring, and extending outwardly from an upper periphery of the inner surface;
   the first step has a vertical surface with a height of about 0.075 inch, substantially parallel to the center axis of the hot edge ring and extending upwardly from an outer periphery of the horizontal surface to an inner periphery of the sloped upper surface;
   an opening angle of the truncated conical surface of the sloped upper surface is about 175° to 179°.

3. The hot edge ring of claim 1, wherein:
   the outer surface has a diameter of about 13.4 inches;
   the second step has a vertical surface with a height of about 0.11 inch, substantially parallel to the center axis of the hot edge ring and extending upwardly from an outer periphery of the lower surface;
   the second step has a horizontal surface with an inner diameter of about 13.3 inches, substantially perpendicular to a center axis of the hot edge ring, and extending outwardly from an upper periphery of the vertical surface to a lower periphery of the outer surface.

4. The hot edge ring of claim 1, wherein an opening angle of the truncated conical surface of the sloped upper surface is 177°.

5. The hot edge ring of claim 1, consisting essentially of low-resistivity boron-doped single-crystalline silicon with a resistivity between about 5 and 100 mΩ·cm.

6. The hot edge ring of claim 1, consisting essentially of silicon carbide.

7. The hot edge ring of claim 1, consisting of CVD SiC having a resistivity of 5000 ohm-cm or less.

8. The hot edge ring of claim 1, further comprising a flat edge at a single location along an inner periphery of the hot edge ring and a single hole extending between the sloped upper surface and the lower surface of the hot edge ring.

9. The hot edge ring of claim 8, wherein the hole has a diameter of about 0.3 inches with a center of the hole about 6.4 inches from the center of the hot edge ring and the flat edge is located on an opposite side of the hot edge ring from the location of the hole, the flat edge located about 5.8 inches from the center of the hot edge ring and the flat edge lying in an axial plane parallel to a center axis of the hot edge ring, the axial plane perpendicular to a radial line passing through the center of the hot edge ring.

10. A plasma processing chamber comprising:
    a substrate support comprising a vertical sidewall extending between an outwardly extending annular support surface and a circular substrate support surface, the substrate support configured such that a semiconductor substrate is supported on the substrate support surface and an overhanging edge of the semiconductor substrate extends outwardly beyond the vertical sidewall;
    an RF coupling ring supported on the annular support surface; and
    the hot edge ring of claim 1 supported on the RF coupling ring.

11. The plasma processing chamber of claim 10, wherein the substrate support further comprises an electrostatic chuck operable to clamp the semiconductor substrate on the substrate support surface.

12. A method of processing a semiconductor substrate, the method comprising:
    transporting a semiconductor substrate into the plasma processing chamber of claim 10 and supporting the substrate on the substrate support;
    introducing a process gas into the plasma processing chamber;
    energizing the process gas into a plasma state; and
    processing the semiconductor substrate with the plasma.

13. The method of claim 12, wherein the processing includes deposition of conductive or dielectric material on the substrate.

14. The method of claim 12, wherein the processing includes plasma etching a layer on the substrate wherein the layer is metal, dielectric or photoresist.

15. The method of claim 14, wherein the plasma etching comprises etching openings in a dielectric material using fluorocarbon and/or hydrofluorocarbon etching gas.

* * * * *